United States Patent [19]

Smoot

[11] Patent Number: 4,818,241

[45] Date of Patent: Apr. 4, 1989

[54] ELECTRICAL INTERCONNECTION DEVICE USING ELASTOMERIC STRIPS

[75] Inventor: Lanny S. Smoot, Morristown, N.J.

[73] Assignee: Bell Communications Research, Inc., Livingston, N.J.

[21] Appl. No.: 118,460

[22] Filed: Nov. 9, 1987

[51] Int. Cl.⁴ .............................................. H01R 9/09
[52] U.S. Cl. ......................................... 439/65; 439/86; 361/415
[58] Field of Search .................. 439/65, 66, 67, 68, 439/70, 71, 74, 86; 361/415, 416

[56] References Cited

U.S. PATENT DOCUMENTS

| | | | |
|---|---|---|---|
| 3,264,525 | 8/1966 | Swengel et al. | 361/416 X |
| 3,382,476 | 5/1968 | Novet | 361/415 X |
| 3,609,463 | 9/1971 | Laboue | 361/413 |
| 3,743,890 | 7/1973 | Neu | 361/416 |
| 3,795,884 | 5/1974 | Kotaka | 439/66 X |
| 3,858,958 | 1/1975 | Davies | 439/66 |
| 3,922,054 | 11/1975 | Dechelette | 439/260 |
| 4,288,139 | 9/1981 | Cobaugh et al. | 439/267 |
| 4,603,928 | 8/1986 | Evans | 439/61 |
| 4,636,018 | 1/1987 | Stillie | 439/66 |
| 4,639,062 | 1/1987 | Taniguchi et al. | 439/586 |
| 4,708,660 | 11/1987 | Claeys et al. | 439/65 |

OTHER PUBLICATIONS

Young, Kenneth C., Jr. and Wilson, Donald K., Physical Design of a Wideband Facility Switch, Sep. 19, 1987, Bellcore Digest, pp. 5–6.

Primary Examiner—Eugene R. LaRoche
Assistant Examiner—Benny Lee
Attorney, Agent, or Firm—James W. Falk; John T. Peoples

[57] ABSTRACT

A circuit board edge connector that utilizes alternating conductive (5) and non-conductive (6) segments of elastomeric strips (4) to provide discrete electrical conductivity between pairs of boards (illustratively 40 and 60). The disclosed structure maintains surface contact between boards (1) and associated elastomeric strips (4), and between associated elastomeric strips (4).

3 Claims, 5 Drawing Sheets

ELECTRICAL INTERCONNECTION DEVICE USING ELASTOMERIC STRIPS

FIELD OF THE INVENTION

The present invention relates generally to the electrical connection of circuit boards. In particular, the invention relates to an edge connector arrangement.

BACKGROUND OF THE INVENTION

Circuit boards or cards are used in numerous electrical devices for mounting electrical components near each other, and electrically inter-connecting those components. When more components are required than can fit on one board, additional boards will typically be used, with one or more electrical connections among boards. An edge connector arrangement allows boards to be placed parallel to each other, or "stacked". This placement allows for numerous boards to be placed in a relatively small space.

There have been numerous edge connector arrangements employed in the art. Descriptions of several such devices may be found in U.S. Pat. Nos. 3,609,463; 3,922,054; 4,288,139; and 4,603,928. Several of such devices utilize a conventional "push-in" edge connector assembly whereby a connector is assembled to a mother board with wires extending between the contact terminals in the plastic housings of the connectors and contacts on the mother board. In this type device, the terminals of the connector frictionally wipe against contacts on a daughter board as it is being inserted into the connector. Such wiping may cause harmful wear. Due to this problem, more recent devices utilize low insertion forces during the mating process, with means for increasing the force applied to the board by the connector after the mating is achieved. Most recently, Zero Insertion Force (ZIF) methods have been utilized, whereby no force is exerted on the board contacts while the board is being inserted or removed. In operation, the board is inserted into the connector while the terminals are in a retracted position, and then a movable cam is actuated to press the connector terminals against the board contacts. The terminals are disengaged from the board by reversing the camming process to allow removal of the board.

Rubber and elastomeric materials, with alternating conductive and non-conductive segments or layers, have previously been used in board connection devices. Such a device is described in U.S. Pat. No. 4,639,062. That device utilizes a rigid rubber structure to hold a board edge while simultaneously forming an electrical connection. Malleable elastomers have been utilized as layers in board assemblies because of their thinness and shock-absorbent qualities, but not as board holding members, due to their lack of rigidity.

Conductively segmented materials are commercially available as standard items in the market. The conductive segments are typically formed by incorporating carbon or metal particles in the elastomeric material, wherein the conductive layers are insulated from each other by the alternate layers of non-conductive elastomeric material.

The difficulties inherent in the prior art interconnection devices are: the necessity for conductive paths through the holding members, which decreases the speed of the device; the physical size of the overlapping portion of connector elements, which lessens the available space on the surfaces of the boards for the placement of electrical components; and, in the non-elastomeric or rubber embodiments, the limitation on the number of connections that will fit on each board, due to the bulkiness of the connectors.

The most serious of these difficulties is the length of the conductive path between boards. Lengthening the path exacerbates two problems, both related to the attainable electrical speed of the overall device.

The first problem is delay, which is reduced in accordance with the reduction in conductive distance. The second is impedance imbalance. To the extent that the impedance of the connector does not match the impedance of the circuit on the circuit board, the detrimental effects of the imbalance are reduced as the length of the connector conductive path is reduced. The end result of the amelioration of these problems is the ability to achieve higher speed electrical operations through the connector.

SUMMARY OF THE INVENTION

The above difficulties are alleviated by the present device. The present invention brings two boards into very close proximity with advantageously short conductive paths between the boards, principally by separating the conductive path from the holding member that maintains the boards in a selected alignment. This design allows the holding member to be sufficiently large and rigid to act as a structural support, while the separate connective path is kept short.

This structure is achieved by slotting the rigid holding members, inserting thin, flexible elastomeric strips, with alternating segments of conductive and nonconductive material, into the slots, and then pushing the board edges or surfaces against the strips. Conductive paths on a surface of the board can be beneficially extended around the edge of the board, in order to make electrical contact with the elastomeric strip.

This results in a shortened connection distance which allows for higher-speed applications than would otherwise be possible. Also, because of the multiplicity of conductive segments in the elastomeric strips, more connections are possible than would be available in a conventional connector arrangement wherein the holding member is part of the conductive path. Finally, because the holding members are not in contact with the planar surfaces of the boards, more space is available on the boards for the placement of electrical components.

The beneficial aspects of the present device will be made more apparent from the following detailed description and drawing.

BRIEF DESCRIPTION AND THE DRAWING

DETAILED DESCRIPTION

Figure 1:
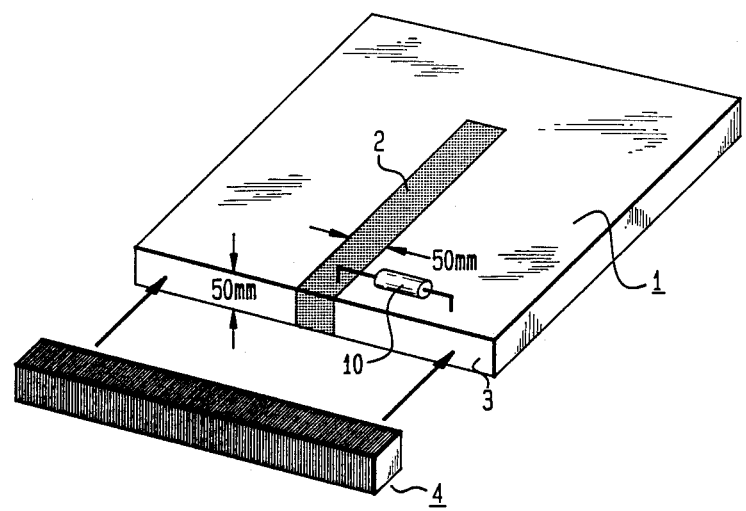
FIG. 1 shows a board with an elastomeric strip about to be placed.

FIG. 1 shows circuit board 1 of 50 mils thickness, with conductive path (circuit) 2 running along the surface of board 1 and overlapping edge 3 of board 1. Component 10 is in electrical contact with path 2. Elastomeric strip 4 is depicted before it is placed along and in surface contact with edge 3.

Figure 2:
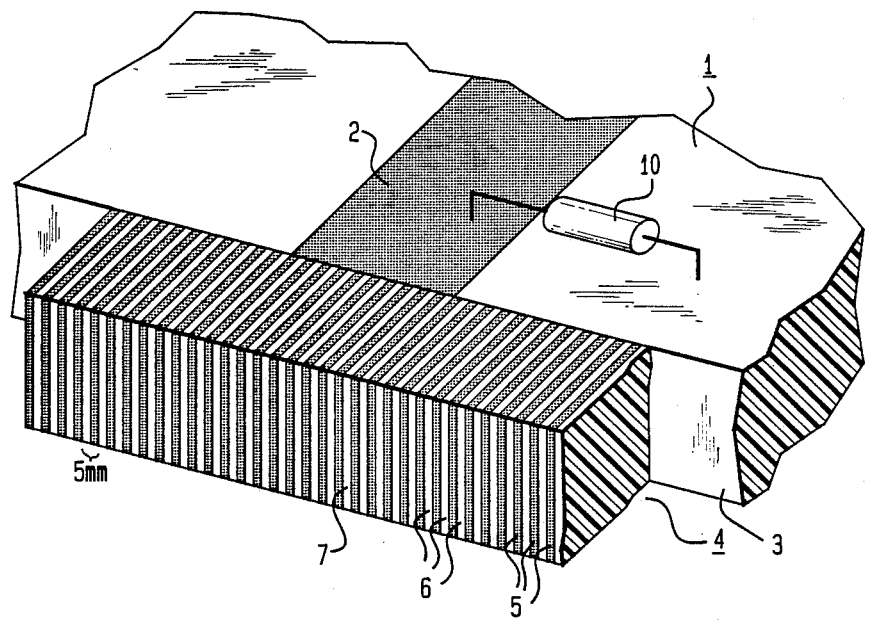
FIG. 2 shows an expanded view of the board edge with its associated strip.

FIG. 2 is an expanded view of FIG. 1 after the strip has been placed along edge 3 and depicts alternating conductive 5 and non-conductive 6 segments of elastomeric strip 4. A typical board 1 of 50 mils thickness, conductive path 2 of width 50 mils, and elastomeric strip 4 of conductive segments 5 every 5 mils results in the configuration as shown, such that 10 conductive segments 5 are associated with conductive path 2.

If elastomeric strip 4, as mounted on board 1, were in surface contact with a second board (not shown), the 10 conductive segments 5 of strip 4 would be in electrical contact with a conductor on the surface of the second board via surface 7 of strip 4. In this way, component 10 would be electrically connected to a similar component on the second board via path 2, strip 4, and the conductor on the second board.

Figure 3:
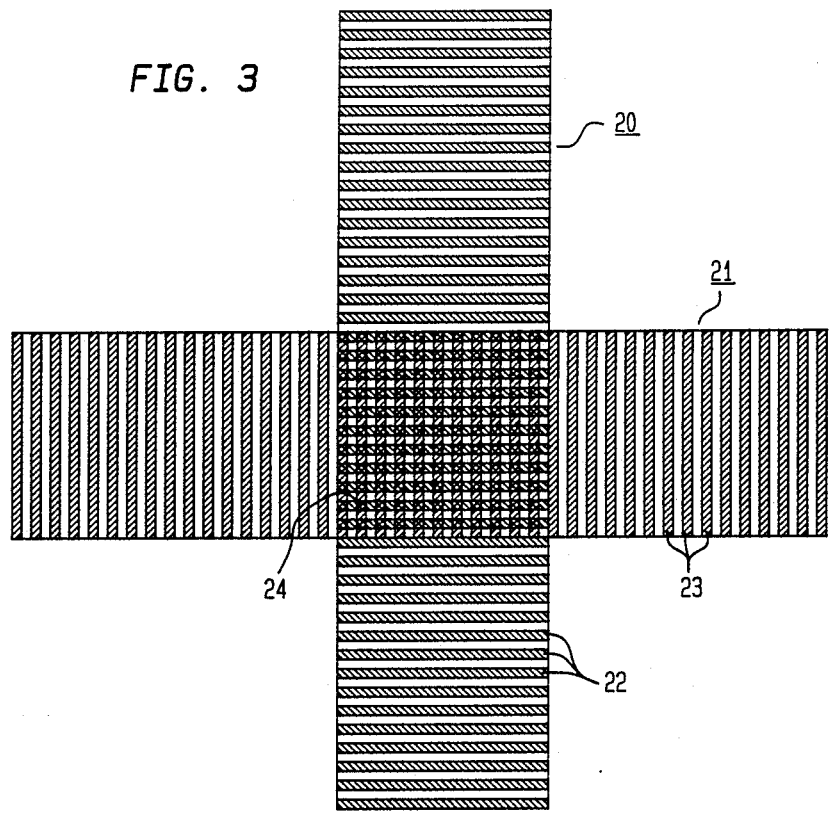
FIG. 3 shows the intersection of two elastomeric strips.

FIG. 3 shows the result of surface contact between two elastomeric strips aligned perpendicularly. Pictured are elastomeric strips 20 and 21, showing a typical alignment of conductive segments 22 and 23. If the width of strips 20 and 21 is 50 mils, with conductive segments 22 and 23 every 5 mils, approximately 100 individual connections 24 are achieved between strips 20 and 21. Because of this multiplicity of connections, some error in alignment of the strips and boards is tolerable.

Figure 4:
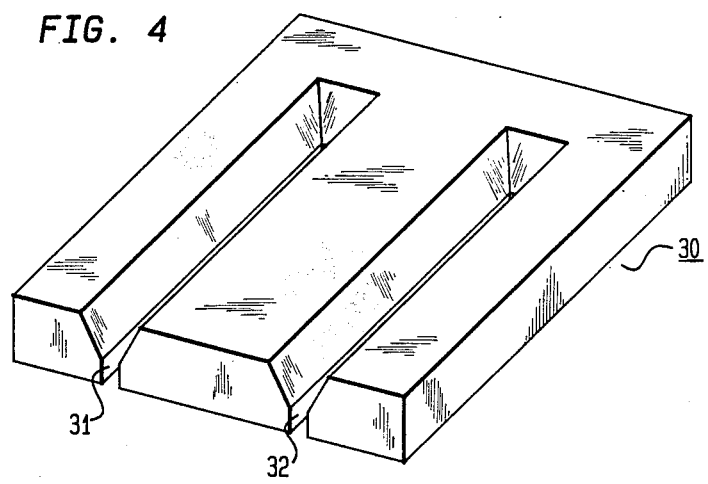
FIG. 4 shows a top view of a planar holding member.

As shown in FIG. 4, holding member 30 can be fashioned with tapered slots 31 and 32. Thin elastomeric strips, with alternating conductive and non-conductive segments, can be squeezed into the bases of the slots (or retained by other mechanical means), with a portion of each strip extending out of the slot, such that circuit board edges may be inserted into the slots in order to allow each associated board edge to press against the associated strip and be stopped by the tapering of the associated slot.

It would be obvious to one of ordinary skill in the art that alternate board registration means could be employed, such as using a non-tapered slot with shoulders, etc.

Figure 5:
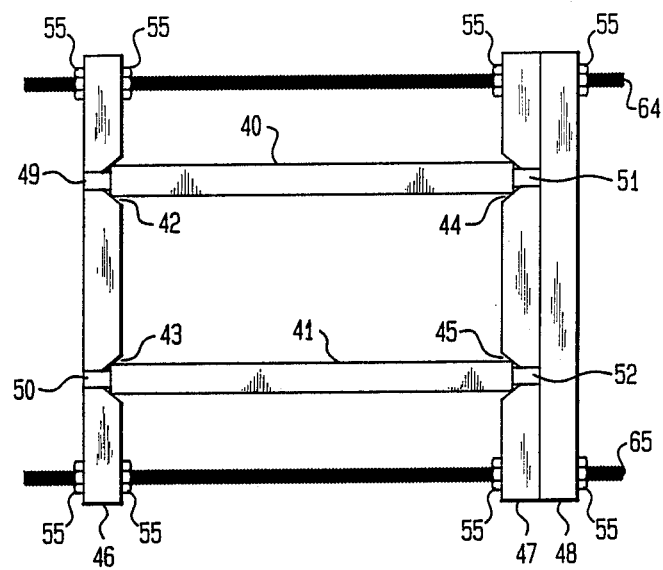
FIG. 5 shows a side view of two circuit boards and three holding members.

FIG. 5 depicts a side view of an embodiment of the invention comprising circuit boards 40 and 41 inserted into associated slots 42-45 of associated holding members 46 and 47 with elastomeric strips 49-52 in the bases of lots 42-45 in surface contact with the associated board edges. Two threaded rods 64 and 65 are shown with associated nuts 55 which illustratively are tightened to exert a compression force on holding members 46 and 47 in order to retain boards 40 and 41 in a position which compresses strips 49-52 against the associated edges of boards 40-41. In this way, circuit boards held by associated elastomeric strips (not shown) of holding member 48 will make edge contact with each of circuit boards 40 and 41 via the associated elastomeric strips in the associated slots.

Figure 6:
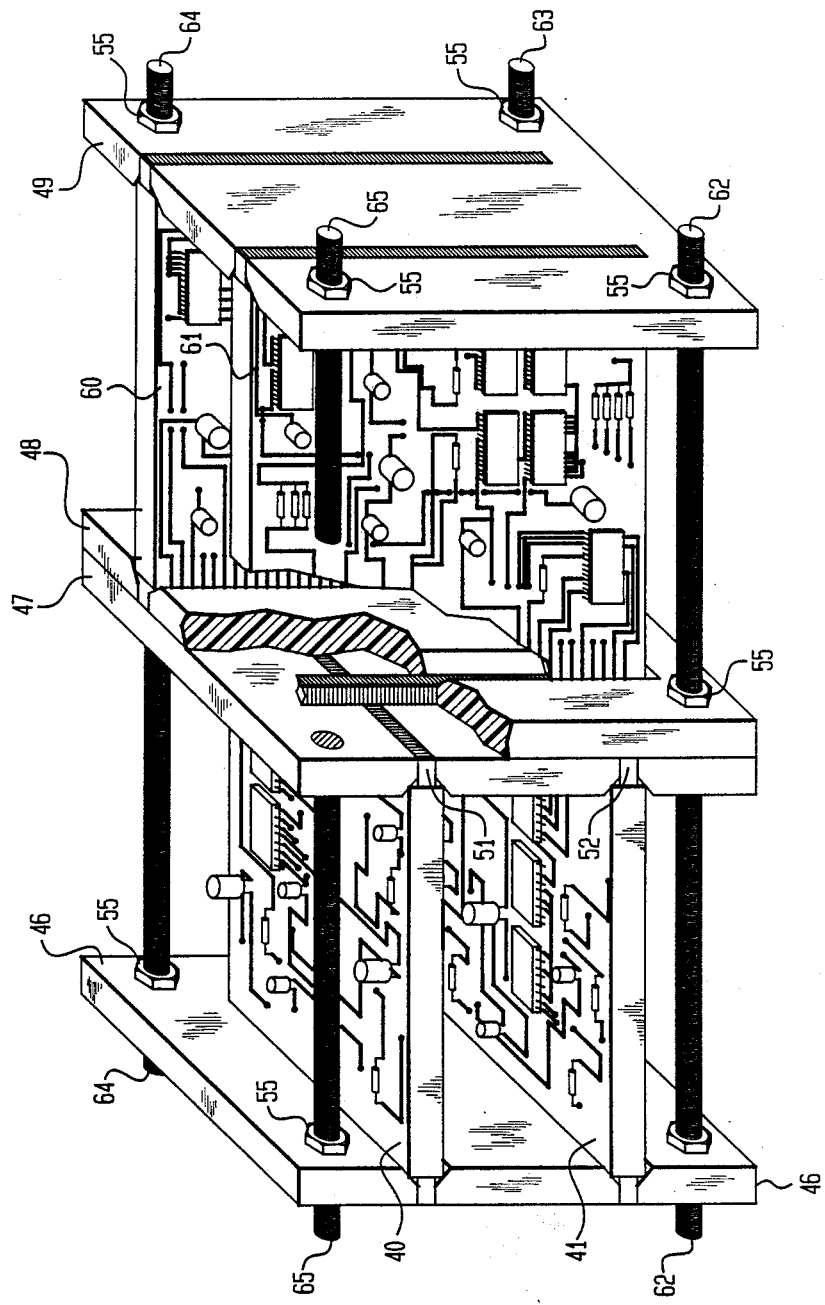
FIG. 6 shows a circuit board connection assembly of an edge-to-edge board arrangement.

FIG. 6 depicts the preferred embodiment wherein a first set of circuit boards 40 and 41 is shown to be in orthogonal edge relationship to a second set of circuit boards 60 and 61. Planar holding members 46-49 are situated as shown such that each circuit board is placed between two associated planar holding members. Rods 62-65, by way of illustration, may be inserted through the corners of holding members 46-49 and are threaded to allow nuts 55 to be tightened to apply a compression force along the axes of the rods in order to push the elastomeric strips (illustratively 51 and 52, retained in holding member 47) against the respective boards (illustratively 40 and 41). Each board in set 40-41 is thereby brought into electrical connectivity with each board in adjacent set 60-61 via the associated elastomeric strips.

Figure 7:
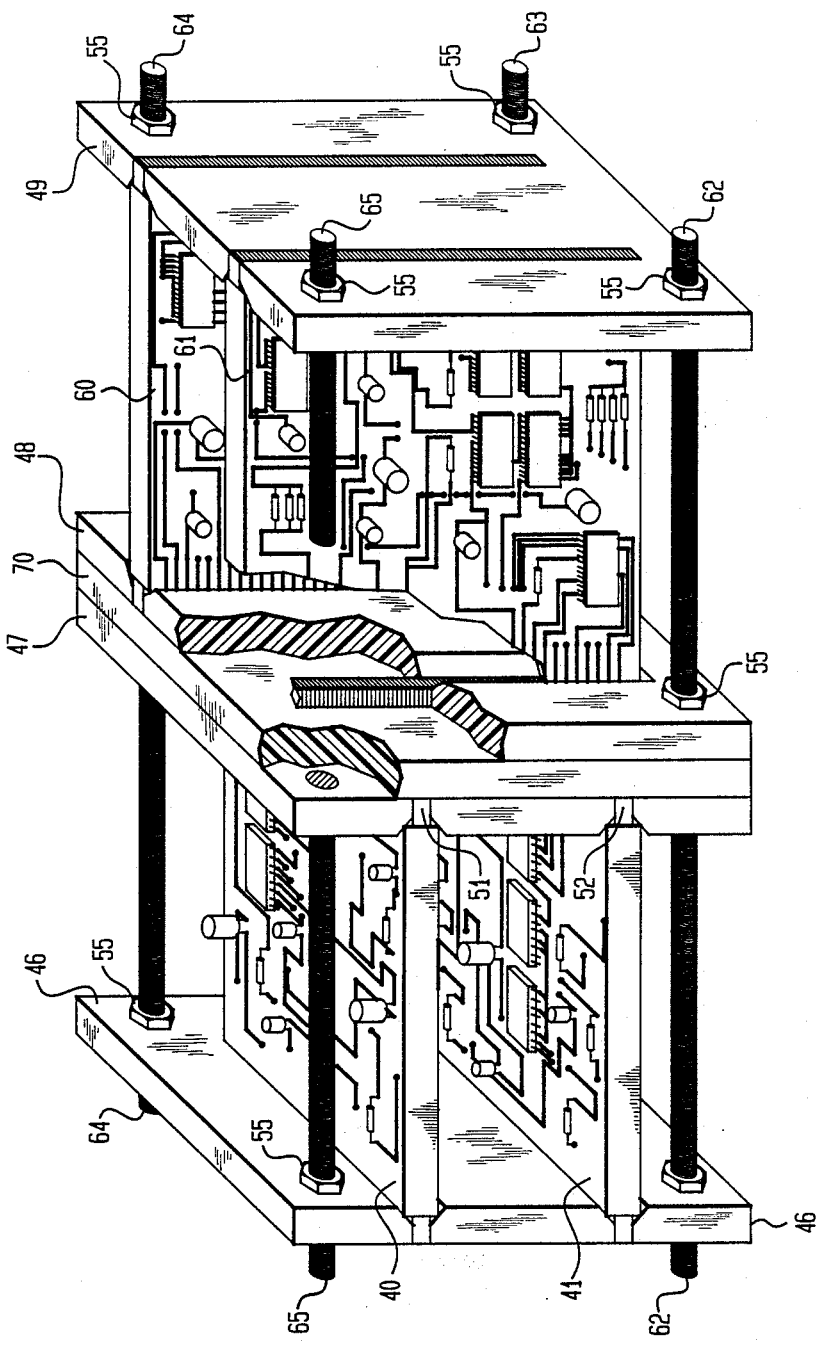
FIG. 7 shows a circuit board connection assembly utilizing a midplane board.

Referring to FIG. 7, another embodiment of the instant invention may be realized by placing midplane circuit board 70 between two adjacent holding members 47 and 48. For example, board 40 will be in electrical contact with the surface of midplane board 70 via elastomeric strip 51. Similarly, boards 41, 60, and 61 would be in electrical contact with midplane board 70 via their associated elastomeric strips. Those ordinarily skilled in the art will readily grasp the increased flexibility of associating a selected point on one board edge with any other selected point on the same or a different board edge, via surface circuits running along both planar surfaces of midplane board 70, with appropriate contact locations and through-plane conductors.

Hollow tubes may replace one or more of rods 62-65 and be utilized to supply power to the midplane boards, and/or to channel a coolant liquid in order to draw heat from the structure.

Other changes in construction will occur to those skilled in the art and different embodiments may be made without departing from the scope of the invention. The foregoing descriptions and diagrams are meant for illustrative purposes only.

What is claimed is:

1. A structure for electrically interconnecting a first and a second set of circuit boards, said structure comprising:
    first and second rectangular, flat holding members each having a plurality of parallel slots therein, and
    elastomeric strips of alternating electrically conductive and non-conductive segments segments placed respectively in each said slot,
    wherein a first edge of each said board of said first set is placed in surface contact along the length of an associated said strip on a first side of said first holding member, a first edge on each said board of said second set is placed in surface contact along the length of an associated strip on a first side of said second holding member, and
    wherein a second side of said second holding member is placed flush and fixedly maintained in surface contact with a second side of said first holding member, an edge of each said board in said first set having an electrically conductive path to an edge of each said board in said second set via the associated two said strips.

2. The structure of claim 1 wherein said slots traverse less than the length of said members and the aperture of said slots is widest at the point where said boards are inserted and narrowest at the point where said strips are situated,
    such that said member is in edge contact with said boards.

3. The structure of claim 1 wherein said structure further comprises a midplane board situated between said first and said second holding members and having conductive paths along its surfaces adjacent said first and second holding members, such that an electrically conductive path can be established between a designated point on said first edge of each said circuit board of said first set and a designated point on said first edge of the same said circuit board or any other of said circuit boards via the associated ones of said strips and said conductive paths of said midplane board.

* * * * *